United States Patent [19]

Levine

[11] Patent Number: 4,666,796
[45] Date of Patent: May 19, 1987

[54] PLATED PARTS AND THEIR PRODUCTION
[75] Inventor: Samuel W. Levine, Roslyn, N.Y.
[73] Assignee: Allied Corporation, Morris Township, Morris County, N.J.
[21] Appl. No.: 868,233
[22] Filed: May 28, 1986

Related U.S. Application Data

[63] Continuation of Ser. No. 655,002, Sep. 26, 1984, Pat. No. 4,601,958.

[51] Int. Cl.$^4$ .............................................. B32B 15/01
[52] U.S. Cl. .................... 428/670; 174/52 FP; 204/40; 357/74; 428/672; 428/673; 428/675; 428/679
[58] Field of Search ............... 428/620, 635, 672, 679, 428/668, 670, 673, 675; 204/40; 174/52 FP, 52 H; 357/74; 427/405

[56] References Cited

U.S. PATENT DOCUMENTS

| | | | |
|---|---|---|---|
| 2,428,033 | 9/1947 | Nachtman | 204/41 |
| 3,199,003 | 8/1965 | Turner | 174/52 H |
| 3,219,748 | 11/1965 | Miller | 174/52 H |
| 3,221,219 | 11/1965 | Emeis et al. | 428/673 |
| 3,362,851 | 1/1968 | Dunster | 428/672 |
| 3,364,064 | 1/1968 | Wijburg | 428/672 |
| 3,823,468 | 7/1974 | Hascoe | 29/588 |
| 3,874,549 | 4/1975 | Hascoe | 174/52 FP |
| 3,946,190 | 3/1976 | Hascoe | 219/85 R |
| 4,243,729 | 1/1981 | Hascoe | 428/75 |
| 4,284,481 | 8/1981 | Hascoe | 29/527.4 |
| 4,411,965 | 10/1983 | Rosegren et al. | 428/672 |
| 4,486,622 | 12/1984 | Dathe et al. | 428/672 |

FOREIGN PATENT DOCUMENTS 0127857 12/1984 European Pat. Off. .

Primary Examiner—Melvyn J. Andrews
Assistant Examiner—Robert L. McDowell
Attorney, Agent, or Firm—Roger H. Criss

[57] ABSTRACT

Plated metal parts, such as sealing lids for semiconductor packages, in which an iron-based alloy layer is electroplated with a first layer of nickel, a first layer of gold is electroplated on the first nickel layer, a second layer of nickel is electroplated onto the first gold layer and a second layer of gold is electroplated onto the second layer of nickel. The resultant plated parts exhibit higher salt atmosphere corrosion resistance than parts plated with a single nickel-gold set. Other metals can be used as the plating layers.

20 Claims, 4 Drawing Figures

4,666,796

PLATED PARTS AND THEIR PRODUCTION

CROSS-REFERENCE TO RELATED APPLICATIONS

This application is a continuation of application Ser. No. 655,002, filed Sept. 26, 1984, U.S. Pat. No. 4,601,958.

BACKGROUND OF THE INVENTION

1. Field of the Invention

This invention relates to plated parts, such as the semiconductor parts, and their production.

2. Description of the Prior Art

Hermetic sealing covers for a container for a semiconductor device, a method for its fabrication and a method for fabricating a sealed container are described in U.S. Pat. Nos. 3,874,549, 3,946,190 and 3,823,468 to Hascoe. Such sealing covers (or lids), ladder frames and other metal parts used in the fabrication of metallized ceramic packages are conventionally electroplated in order to provide a package which is resistant to salt atmosphere corrosion, among other reasons. One specification to which such finished packages are typically required to adhere is Mil-Std-883C, Method 1009.4, Test Condition A, Salt Atmosphere (Corrosion).

The sealing covers described in the aforementioned patents are conventionally formed of a base material which is electroplated. The base material is usually Kovar or Alloy 42, both of which contain iron as a major constituent. The electroplating sequence is to plate the base metal with nickel and then with gold. A method of fabricating and plating such covers are disclosed in U.S. Pat. No. 4,284,481 to Hascoe, and the plated covers are disclosed in U.S. Pat. No. 4,243,729 to Hascoe. The disclosures of all of the aforementioned Hascoe patents are expressly incorporated herein by reference.

The industry experience has been that it is extremely difficult to pass the salt atmosphere corrosion test and the results obtained are not always reproducible.

Electroplating of metal parts such as semiconductor package parts produces very thin coatings. Thicknesses are usually in the one to five hundred microinch range. Such plating thicknesses exhibit porosity which may leave tiny pinhole paths between the surface of the basis metal and the top surface of the electroplated coating. Salt atmosphere which contains ionized sodium and chlorine is very corrosive. It reacts with the iron, and other constituents of the base metal to form oxides. The salt atmosphere penetrates through the tiny pinholes to cause corrosion of the electroplated metal parts and failure to meet the aforementioned specification.

The most commonly used electroplated coatings on semiconductor packages are nickel on the basis metal and gold on the nickel. Nickel acts as a diffusion barrier to keep the gold from diffusing into the basis metal at elevated temperatures such as occur during solder sealing. Nickel also acts as a corrosion barrier. The outside coating of gold has two functions. It maintains an oxide-free surface for the soldering of the package and because of its oxidation resistant characteristic acts as a corrosion barrier. Typically, a layer of 100 microinches of pure nickel is plated on the base layer, and then a layer of 50 microinches of pure gold.

In order to increase the corrosion resistance of plated parts, it would appear that the amount of gold deposited on the substrate should be increased. However, this would greatly increase the cost of the plated part and requires a significant increase in thickness of the gold layer before any appreciable increase in corrosion resistance is noted. It would be desirable to provide plated parts which have improved salt atmosphere corrosion resistance, as well as a process for producing such parts. It would also be desirable to provide parts which have the requisite corrosion resistance, without an economic penalty.

SUMMARY OF THE INVENTION

In accordance with this invention, there is provided a plated metal part comprising:

a base metal layer;

a first layer of nickel or a nickel based alloy plated on the base metal;

a first layer of gold or a gold based alloy plated on the first layer of nickel or nickel based alloy;

a second layer of nickel or a nickel based alloy plated on the first layer of gold or gold based alloy; and a second layer of gold or a gold based alloy plated on the second layer of nickel or nickel based alloy.

Further in accordance with this invention, there is provided a plated metal part comprising:

a base metal layer comprising as its major metallic component a base metal having a certain electromotive potential in the electromotive series of metals;

a first metal layer of a first metal composition plated on the base metal layer, the first metal composition comprising as its major metallic component a first metal having an electromotive potential more positive than the electromotive potential of the base metal;

a second metal layer of a second metal composition plated on the first metal layer, the second metal composition comprising as its major metallic component a second metal having an electromotive potential more positive than the electromotive potential of the first metal; and a third layer of a third metal composition plated on the second metal layer, the third metal composition having as its major metallic component a third metal having an electromotive potential less positive than the electromotive potential of the second metal.

Also in accordance with this invention, there is provided a process for plating metal parts comprising:

plating on a base metal layer a first layer of nickel or a nickel based alloy;

plating a first layer of gold or a gold based alloy on the first layer of nickel or a nickel based alloy;

plating a second layer of nickel or a nickel based alloy on the first layer of gold or a gold based alloy; and plating a second layer of gold or a gold based alloy on the second layer of nickel or a nickel based alloy.

In further accordance with this invention, there is provided in a process for electroplating metal parts for improved corrosion resistance wherein a base metal layer is plated with a layer of nickel or a nickel based alloy and a layer of gold is plated onto the layer of nickel to a first predetermined thickness, the improvement comprising:

plating the layer of gold or a gold based alloy onto the layer of nickel or a nickel based alloy to a second predetermined thickness;

plating a second layer of nickel or a nickel based alloy on the layer of gold or a gold based alloy; and plating a second layer of gold or a gold based alloy onto the second layer of nickel or a nickel based alloy to a third predetermined thickness, the sum of the second and third predetermined thicknesses being approximately equal to the first predetermined thickness, whereby the metal parts have improved corrosion resistance.

Also in accordance with this invention, there is provided a process for plating metal parts comprising:

plating a base metal layer comprising as its major metallic component a base metal having a certain electromotive potential in the electromotive series of metals, with a first layer of a first metal composition, the first metal composition comprising as its major metallic component a first metal having an electromotive potential more positive than the electromotive potential of the base metal;

plating onto the first layer a second metal layer of a second metal composition, the second metal composition comprising as its major metallic component a second metal having an electromotive potential more positive than the electromotive potential of the first metal; and plating onto the second layer a third metal layer of a third metal composition, the third metal composition having as its major metallic component a third metal having an electromotive potential less positive than the electromotive potential of the second metal.

It has been surprisingly discovered that when a second set of nickel and gold layers is plated onto a base metal, with the total gold thickness being approximately the same as with a conventional nickel-gold plated part, the corrosion resistance of the part is greatly improved.

DESCRIPTION OF THE PREFERRED EMBODIMENT

It has been surprisingly discovered that plated parts which consistently pass the salt spray corrosion test and still conform to various gold thickness specifications can be produced by first plating nickel on the base metal, at a conventional thickness, then plating gold on the nickel at a thickness of about one-half of the desired total gold plating thickness, then plating another nickel layer on the gold at a thickness approximately equal to the first nickel plating thickness, and then plating a second layer of gold on the second layer of nickel at a thickness of about one-half of the desired total gold plating thickness. In this manner, the total amount of gold used is about the same as that used in conventional products.

Figure 1:
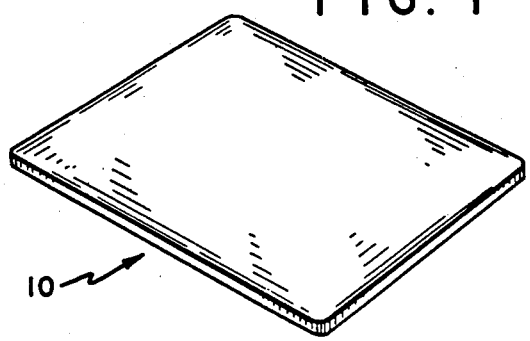
FIG. 1 is a perspective view of a sealing lid which has been plated in accordance with this invention.
Figure 2:
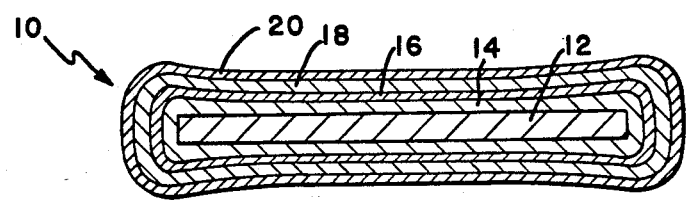
FIG. 2 is a cross-sectional view of the sealing lid of FIG. 1, the thickness of the plated layers being greatly exaggerated for clarity of illustration.

With reference to the drawings, there is shown in FIGS. 1 and 2 a sealing lid or cover 10 which has been plated by the multi-layering plating process of this invention. Sealing lid 10 includes a base material 12. Base material 12 is a base metal which is preferably formed from an iron-based alloy. Most preferably, the base metal is Alloy 42, or Kovar, also known as Alloy F-15. Kovar alloy comprises about 17 weight percent cobalt, 29 weight percent nickel, the balance iron and a minor percentage of other elements and Alloy 42 comprises about 42 weight percent nickel, the balance iron and a minor percentage of other elements. Base material 10 may have any desired thickness. Typically, the base material has a thickness on the order of about 10,000 microinches (0.01 inch).

A first layer 14 of nickel or a nickel based alloy is plated on the base material 12 by any conventional electroplating process, including barrel plating, strip plating, rack plating or a combination of such techniques. The so-called "dog-bone" thickness profile of barrel plating of nickel layer 14 is shown in FIG. 1. The thickness of the nickel layer, measured at the center of layer 14, is preferably in the range of about 10 to 300 microinches, more preferably in the range of about 50 to 200 microinches. All references to the thickness of layers herein refer to the thickness at the center of the layer. Most preferably, the thickness of nickel of layer 14 is about 100 microinches. A first layer 16 of gold or a gold based alloy is plated on nickel layer 14 also by any conventional plating technique, although the profile of barrel plated part is shown in the drawing. The thickness of gold layer 16, is preferably in the range of about 5 to 150 microinches, more preferably about 10 to 75 microinches. Most preferably, the thickness of gold at the center of layer 16 is about 25 microinches. A second layer 18 of nickel or a nickel based alloy is plated onto gold layer 16 by an electroplating process, and preferably has a thickness in the ranges indicated for layer 14. Preferably, nickel layer 18 has approximately the same thickness as first nickel layer 14. A second layer 20 of gold or a gold based alloy is plated onto nickel layer 18 by an electroplating process, and preferably has a thickness in the range indicated for layer 16. Preferably, gold layer 20 has approximately the same thickness as first gold layer 16. The resulting product greatly minimizes corrosion when the part is subjected to a salt spray atmosphere.

Although the exact reason is not known why this multi-layering technique is effective to reduce corrosion when the same amount of noble metal is applied on the part, there are two mechanisms which may account for the reduction in corrosion.

Figure 3:
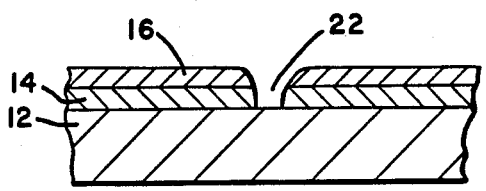
FIG. 3 is a cross-sectional view of a prior art sealing lid which has a channel in the plated layers to show the effects of corrosion, the thickness of the plated layers being greatly exaggerated for clarity of illustration.

One mechanism is based on the galvanic action which causes corrosion. Referring to FIG. 3, there is shown a channel 22, in the plating on the Kovar base layer 12. This channel may result from a defect on the surface of layer 12, or a porosity opening in the nickel plate 14. Gold layer 16 does not bridge the opening and if the plating sequence were terminated with the first nickel layer 14 and gold layer 16, corrosion would take place. The gold and elements of the base metal (iron, nickel and cobalt) act as a galvanic cell, in the elements of the base metal being transported by electrolytic action to the surface and are oxidized. In several cases the corrosion proceeds at a high rate and a deep pit is formed in the base layer. Gold layer 16 which has a positive electromotive potential and iron ions which have a negative electromotive potential are transported by the electromotive force (EMF) difference between gold and iron to the gold surface. Iron oxide is formed and a corrosion pit results.

In contrast in the present invention, with the second nickel layer 18 and the second gold layer 20, there is no EMF difference between the two gold layers and there is no transport of iron ions, for example, to the surface of the second gold layer. This is because the nickel metal has a lower electromotive force than the gold. As soon as the channel is filled with metal oxides up to gold layer 16, the electrolyte becomes depleted and no further corrosion action takes place. The channels are so small in diameter that with the stopping-off of galvanic action at gold layer 16, no observable corrosion is observed.

A second mechanism for explaining the reduction in corrosion sites is the statistical probability that each successive layer of plating will cover porosity defects in the lower layers. Even though each successive layer may have its own channel sites, the probability that such defect sites will coincide with defects in other layers is very small. It is likely that the corrosion reduction is due to both mechanisms.

The application of a third sequence of nickel and gold plating will further reduce the probability of corrosion taking place. The principle of multilayering is therefore extended to more than two sets of plating sequences for corrosion reduction.

Figure 4:
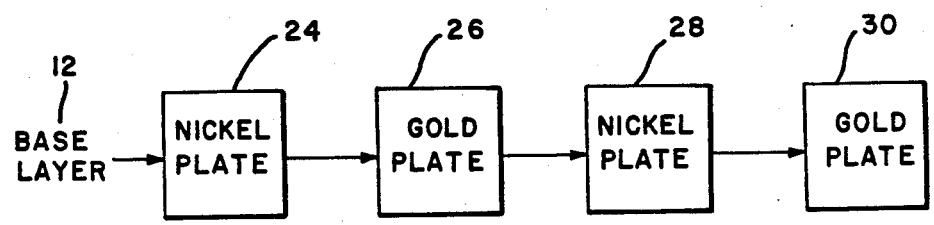
FIG. 4 is a schematic representation of the process of this invention.

With reference to FIG. 4, there is shown a schematic representation of the process of this invention in which the base layer 12 is plated with a first nickel plate in nickel plating bath 24, is then advanced to gold plating bath 26, in which a first gold layer is plated onto the first nickel layer, is then advanced to nickel plating bath 28, in which a second nickel layer is applied, and is then forwarded to gold plating bath 30 in which as second gold layer is applied. Obviously, additional plating steps are necessary to provide additional multilayered sets of plating. As mentioned earlier, any conventional electroplating technique can be utilized, such as barrel plating, strip plating, rack plating, etc. For example, individual lids can be barrel or rack plated with the individual plated layers. All the layers can be deposited by using one such technique, or the plating techniques can be intermixed. For example, the first two layers can be applied by strip plating on a strip of the base layer, lids (or other parts) punched out from the strip and the final multilayer set being applied by barrel plating.

Although the above description has been directed to a multilayering technique using nickel and gold, this invention is not limited to such metals. In general, a first metal layer can be plated onto a base metal layer, with the metal in the first metal layer having a more positive electromotive potential in the electromotie series of metals than the metal of the base layer. The second metal layer which is plated over the first metal layer has as its major metallic constituent a metal which has an electromotive potential more positive than the electromotive potential of the metal of the first layer. The third metal layer which is plated over the second metal layer has as its major metallic constituent a metal which has an electromotive potential less positive than the electromotive potential of the second layer. Finally, the fourth metal layer which is plated over the third metal layer has as its major metallic constituent a metal which has an electromotive potential more positive than the metal in the third metal layer.

Because the electromotive potential of the metal of the third layer is less than the electromotive potential of the metal of the second layer, there is no "driving" force which would continue to transport the iron or other oxidizable ions of the base layer to the surface. Hence, the second and third plated layers do not form a galvanic cell which would tend to transport the iron ions to the surface where they would otherwise be oxidized.

Table I lists the normal electrode potential of the metals in the electromotive series.

TABLE I

| ELECTROMOTIVE SERIES | |
|---|---|
| METAL | NORMAL ELECTRODE POTENTIAL* (Volts) |
| Gold | +1.4 |
| Platinum | +1.2 |
| Iridium | +1.0 |
| Palladium | +0.83 |
| Silver | +0.8 |
| Mercury | +0.799 |
| Osmium | +0.7 |
| Ruthenium | +0.45 |
| Copper | +0.344 |
| Bismuth | +0.20 |
| Antimony | +0.1 |
| Tungsten | +0.05 |
| Hydrogen | +0.000 |
| Lead | −0.126 |
| Tin | −0.136 |
| Molybdenum | −0.2 |
| Nickel | −0.25 |
| Cobalt | −0.28 |
| Indium | −0.3 |
| Cadmium | −0.402 |
| Iron | −0.440 |
| Chromium | −0.56 |
| Zinc | −0.762 |
| Niobium | −1.1 |
| Manganese | −1.05 |
| Vanadium | −1.5 |
| Aluminum | −1.67 |
| Beryllium | −1.70 |
| Titanium | −1.75 |
| Magnesium | −2.38 |
| Calcium | −2.8 |
| Strontium | −2.89 |
| Barium | −2.90 |
| Potassium | −2.92 |

*The potential of the metal is with respect to the most reduced state except with copper and gold where the cupric ($Cu^{++}$) and auric ($Au^{+++}$) ions are usually more stable.

Also, the tendency for oxidation and corrosion to occur is more pronounced in plated layers which are relatively thin, and hence may be porous. In general, corrosion may occur with plated layers in which the plating thickness is less than about 500 microinches.

Preferably, the metals of the first and third layers are selected from the group of nickel, titanium, chromium, tin and their alloys. Most preferably, the metal of the first and third layers, which act as diffusion barriers, is nickel.

Also preferably, the metals of the second and fourth layers are selected from the group of gold, copper, silver, palladium, platinum or their alloys. Most preferably, the metal of the second and fourth layers, which act as corrosion resistant layers, is gold.

Preferably, the metals of the first and third layers are the same, and are plated to approximately the same thickness, and the metals of the second and fourth layers are the same, and are plated to approximately the same thickness.

Although for metal parts used in semiconductor devices the outer layer is of a noble metal, in other plated parts the outer layer need not be a noble metal. In such instances, a fourth metal layer need not be applied to the third metal layer.

As pointed out earlier, the plated metal parts of this invention preferably are sealing lids for semiconductor packages. These lids are used to form hermetically sealed packages, such as dual-in-line packages. Typically, a semiconductor device in hermetically sealed with such lids on a ceramic base.

To further illustrate this invention, the following non-limiting examples are given.

EXAMPLE 1

Sealing lids of 0.505 inch square were punched from a sheet of Kovar alloy. The lids were deburred and plated in a barrel plating apparatus according to the following sequence: 100 microinches (nominal) nickel on the Kovar alloy, 25 microinches (nominal) gold (99.99% purity) on the nickel, 100 microinches (nominal) nickel on the gold and 25 microinches (nominal) gold (99.99% purity) on the nickel. Cross-sectioning of 5 lids resulted in actual plating thickness averages as follows:

| | |
|---|---|
| First nickel layer = | 118 microinches |
| First gold layer = | 22 microinches |
| Second nickel layer = | 105 microinches |
| Second gold layer = | 27 microinches |

A group of 20 of the aboved plated lids were placed in a salt atmosphere chamber and tested according to Mil-Std 883C Method 1009.4 Test Condition A (24 hours).

The 20 lids were measured for corrosion resistance using a comparison chart developed from measurements of lids on a Leitz TAS image analyzer. The average corrosion in percent of area was determined to be less than 0.1%. Since the above specification defines failure as evidence of corrosion over more than 5 percent of metal surface, these lids clearly passed the test.

In comparison, when lids were plated with a conventional plating of 140 microinches of nickel and 60 microinches of gold the average corrosion value was 2 percent. However, such average corrosion values may range from 2 to 5%, and sometimes exceeds 5%, thereby failing the above test.

The present invention thus provides plated parts which have improved salt atmosphere corrosion resistance, and a process for making such parts. Preferably, the parts are semiconductor components such as sealing covers for semiconductor packages. Such parts are provided without an economic penalty as would result from a substantial increase in the use of gold.

I claim:

1. A sealing cover for a hermetic package containing a semiconductor device, said cover comprising:
   a base layer of a metal which is corrodable in a salt atmosphere environment;
   a first layer of nickel or a nickel based alloy plated on said base metal;
   an intermediate layer of a metal selected from the group consisting of copper, silver, palladium, platinum or their alloys plated on said first layer of nickel or a nickel based alloy;
   a second layer of nickel or a nickel based alloy plated on said intermediate layer; and
   a layer of gold or a gold based alloy plated on said second layer of nickel or a nickel based alloy.

2. The sealing cover of claim 1, wherein the base metal layer comprises an iron-based alloy.

3. The sealing cover of claim 2 wherein said metal of said intermediate layer comprises copper or a copper-based alloy.

4. The sealing cover of claim 2, wherein said metal of said intermediate layer comprises silver or a silver-based alloy.

5. The sealing cover of claim 2, wherein said metal of said intermediate layer comprises palladium or a palladium-based alloy.

6. The sealing cover of claim 2, wherein said metal of said intermediate layer comprises platinum or a platinum-based alloy.

7. The sealing cover of claim 2, wherein said iron-based alloy is selected from the group consisting of an alloy comprising about 17 weight percent cobalt, 29 weight percent nickel, the balance iron and a minor percentage of other elements or an alloy comprising about 42 weight percent nickel, the balance iron and a minor percentage of other elements.

8. The sealing cover of claim 7, wherein said iron-based alloy is an alloy comprising 17 weight percent cobalt, 29 weight percent nickel the balance iron and a minor percentage of other elements.

9. The sealing cover of claim 2, wherein each of said plated players has a thickness less than about 500 microinches.

10. The sealing cover of claim 9, wherein each of said nickel layers has a thickness of between about 10 to 300 microinches.

11. The sealing cover of claim 10, wherein the thickness of each of said intermediate layer and said gold layer is in the range of about 5 to 150 microinches.

12. A process for plating a sealing cover for a hermetic package containing a semiconductor device, said method comprising:
    plating on a base layer of a metal which is corrodable in a salt atmosphere environment, a first layer of nickel or a nickel based alloy on said base metal;
    plating an intermediate layer of a metal selected from the group consisting of copper, silver, palladium, platinum or their alloys on said first layer of nickel or a nickel based alloy;
    plating a second layer of nickel or a nickel based alloy on said intermediate layer; and
    plating a layer of gold or a gold based alloy on said second layer of nickel or a nickel based alloy.

13. The process of claim 12, wherein said base metal layer comprises an iron-based alloy.

14. The process of claim 13, wherein said metal of said intermediate layer comprises copper or a copper based alloy.

15. The process of claim 13, wherein said metal of said intermediate layer comprises silver or a silver based alloy.

16. The process of claim 13, wherein said metal of said intermediate layer comprises palladium or a palladium based alloy.

17. The process of claim 13, wherein said metal of said intermediate layer comprises platinum or a platinum based alloy.

18. The process of claim 13, wherein the each of said plated layers is plated to a thickness less than about 500 microinches.

19. The process of claim 18, wherein said first and second nickel layers are plated to a thickness of between about 10 to 300 microinches.

20. The process of claim 19, wherein each of said intermediate layer and said gold layer are plated to a thickness of between about 5 to 150 microinches.

* * * * *